US009847096B2

(12) United States Patent
Konjeti et al.

(10) Patent No.: US 9,847,096 B2
(45) Date of Patent: Dec. 19, 2017

(54) ENVIRONMENT SENSING INTELLIGENT APPARATUS

(71) Applicant: HARMAN INTERNATIONAL INDUSTRIES, INC., Stamford, CT (US)

(72) Inventors: Srikanth Konjeti, Bangalore (IN); Anandhi Ramesh, Karnataka (IN)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 15/118,807

(22) PCT Filed: Feb. 20, 2015

(86) PCT No.: PCT/US2015/016805
§ 371 (c)(1),
(2) Date: Aug. 12, 2016

(87) PCT Pub. No.: WO2015/127194
PCT Pub. Date: Aug. 27, 2015

(65) Prior Publication Data
US 2017/0053666 A1 Feb. 23, 2017

Related U.S. Application Data

(60) Provisional application No. 61/942,291, filed on Feb. 20, 2014.

(51) Int. Cl.
H04R 29/00 (2006.01)
G10L 25/84 (2013.01)
(Continued)

(52) U.S. Cl.
CPC .............. G10L 25/84 (2013.01); G06F 3/165 (2013.01); G10L 25/15 (2013.01);
(Continued)

(58) Field of Classification Search
CPC ... H04R 29/001; H04R 2430/01; G10L 25/84; G10L 25/15; G06F 3/165; H04M 1/6058
(Continued)

(56) References Cited

U.S. PATENT DOCUMENTS 6,990,211 B2 1/2006 Parker
2007/0189544 A1 8/2007 Rosenberg
(Continued)

FOREIGN PATENT DOCUMENTS

JP 2010239508 A 10/2010
WO 2012127278 A1 9/2012

OTHER PUBLICATIONS

International Search Report from corresponding International Application No. PCT/US2015/016805 dated May 29, 2015.
(Continued)

Primary Examiner — Melur Ramakrishnaiah
(74) Attorney, Agent, or Firm — Brooks Kushman P.C.

(57) ABSTRACT

An audio playback device may drive an audio reproduction device at a volume level. An audio capture device may convert sound waves into audio input. An environment sensing device may detect, based on the audio input, environmental conditions surrounding a user of the audio playback device, the environmental conditions including a loudness estimation indicative of a level of background noise included in the audio input and an audio content classification indicative of presence of speech in the audio input. The environment sensing device may also determine, according to the environmental conditions, a playback action to alter the volume level being provided by the audio playback device, and provide, to the audio playback device, an adjustment to the volume level in accordance with the playback action.

20 Claims, 5 Drawing Sheets

(51) Int. Cl.
  *H04M 1/60* (2006.01)
  *G06F 3/16* (2006.01)
  *G10L 25/15* (2013.01)

(52) U.S. Cl.
  CPC ........ *H04M 1/6058* (2013.01); *H04R 29/001* (2013.01); *H04R 2430/01* (2013.01)

(58) Field of Classification Search
  USPC ........ 381/57, 71.6, 74, 309, 109, 72; 700/94
  See application file for complete search history.

(56) References Cited

U.S. PATENT DOCUMENTS

| | | | | |
|---|---|---|---|---|
| 2007/0223717 | A1* | 9/2007 | Boersma | H04M 1/6058 381/74 |
| 2008/0089530 | A1 | 4/2008 | Bostick et al. | |
| 2009/0138507 | A1 | 5/2009 | Burckart et al. | |
| 2009/0316931 | A1 | 12/2009 | Dai et al. | |
| 2010/0111337 | A1* | 5/2010 | Silber | H04R 5/04 381/309 |
| 2010/0215198 | A1* | 8/2010 | Ngia | H04R 1/1016 381/309 |
| 2010/0246807 | A1* | 9/2010 | Kemmochi | H04M 1/05 379/441 |
| 2011/0196519 | A1 | 8/2011 | Khoury et al. | |
| 2012/0070014 | A1 | 3/2012 | Choi | |
| 2012/0071997 | A1* | 3/2012 | Aliakseyeu | G08G 1/0965 700/94 |
| 2012/0326834 | A1* | 12/2012 | Kennedy | H04M 1/72519 340/3.1 |

OTHER PUBLICATIONS

International Preliminary Report on Patentability re PCT/US2015/016805 dated Aug. 23, 2016.

* cited by examiner

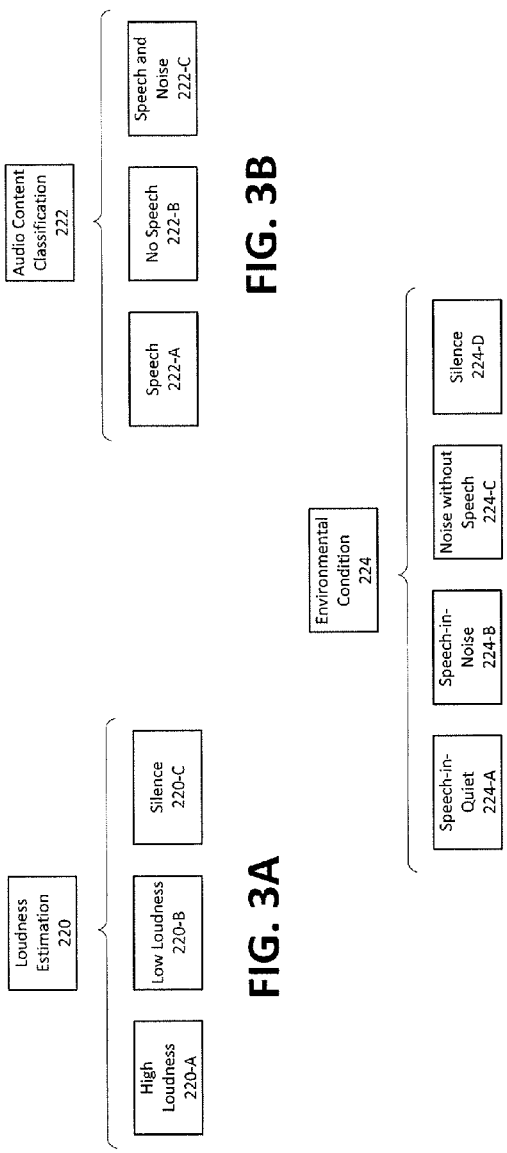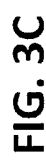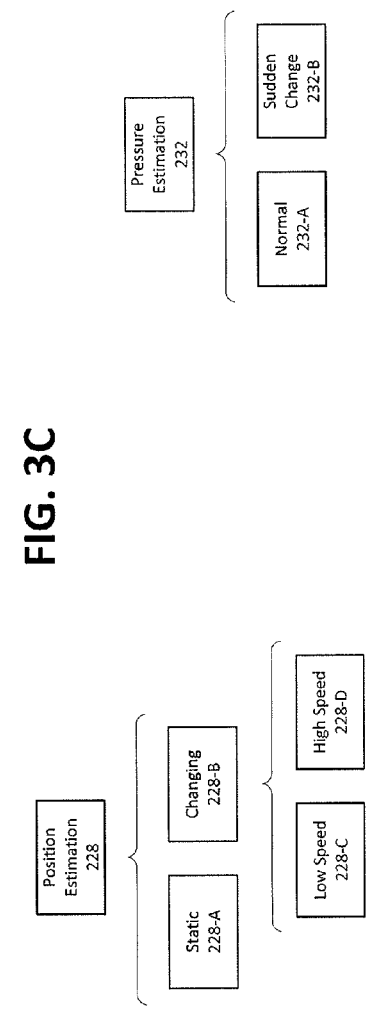

ENVIRONMENT SENSING INTELLIGENT APPARATUS

CROSS-REFERENCE TO RELATED APPLICATION

This application is the U.S. national phase of PCT Application No. PCT/US2015/016805 filed Feb. 20, 2015, which claims the benefit of U.S. provisional application Ser. No. 61/942,291 filed Feb. 20, 2014, the disclosures of which are hereby incorporated in their entirety by reference herein.

TECHNICAL FIELD

Aspects disclosed herein generally relate to environment sensing intelligent headphones and mobile devices.

BACKGROUND

With the increased popularity of portable music players and mobile phones, headphone use has correspondingly increased in public environments and situations. However, users of such devices may find it difficult to keep track of their public surroundings and listen to audio at the same time.

SUMMARY

In one or more embodiments, a system includes an audio playback device configured to drive an audio reproduction device at a volume level; an audio capture device configured to convert sound waves into audio input; and an environment sensing device configured to detect, based on the audio input, environmental conditions surrounding a user of the audio playback device, the environmental conditions including a loudness estimation indicative of a level of background noise included in the audio input and an audio content classification indicative of presence of speech in the audio input, determine, according to the environmental conditions, a playback action to alter the volume level being provided by the audio playback device, and provide, to the audio playback device, an adjustment to the volume level in accordance with the playback action.

In one or more embodiments, a method includes detecting, based on audio input from an audio capture device, environmental conditions surrounding a user of an audio playback device driving an audio reproduction device at a volume level, the environmental conditions including a loudness estimation indicative of a level of background noise included in the audio input and an audio content classification indicative of presence of speech in the audio input; determining, according to the environmental conditions, a playback action to alter the volume level being provided by the audio playback device; and providing, to the audio playback device, an adjustment to the volume level according to the playback action.

In one or more embodiments, a non-transitory computer-readable medium includes computer instructions that, when executed by a processor of an audio playback device, cause the audio playback device to perform operations including to detect, based on audio input from an audio capture device, environmental conditions surrounding a user of an audio playback device driving an audio reproduction device at a volume level, the environmental conditions including a loudness estimation indicative of a level of background noise included in the audio input and an audio content classification indicative of presence of speech in the audio input; determine, according to the environmental conditions, a playback action to alter the volume level being provided by the audio playback device; and provide an adjustment to the volume level in accordance with the playback action.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

FIGS. 3A-3E are block diagrams of exemplary data element values utilized by the intelligent environment sensing apparatus;

DETAILED DESCRIPTION

As required, detailed embodiments of the present disclosure are provided herein; however, it is to be understood that the disclosed embodiments are merely illustrative of the disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

A user of headphones may be unable to hear a person who is trying to get his or her attention. If the user does understand that a person is talking to him or her, the user may be required to remove his or her headphones to respond. Moreover, while walking or driving in public with headphones on, the user may be unable to hear sounds indicative of entering an unsafe situation, such as the honking of oncoming traffic.

Various audio devices used in connection with media playback, such as headphones, a portable audio device, or other suitable devices may include hardware and software for implementing an intelligent environment sensing apparatus. The headphone or other audio device may execute or perform the intelligent environment sensing by performing audio adjustments to the volume of audio being listened to by the user based on sensing the environment of the headphone user. In an example, the audio device may identify a condition requiring the user's attention, and may notify the user by muting or reducing headphone volume. In another example, the audio device may control headphone volume to ensure that sound output from the headphone is audible above current environmental noise. The audio device may also be configured to respond to voice commands from the user.

Figure 1A:
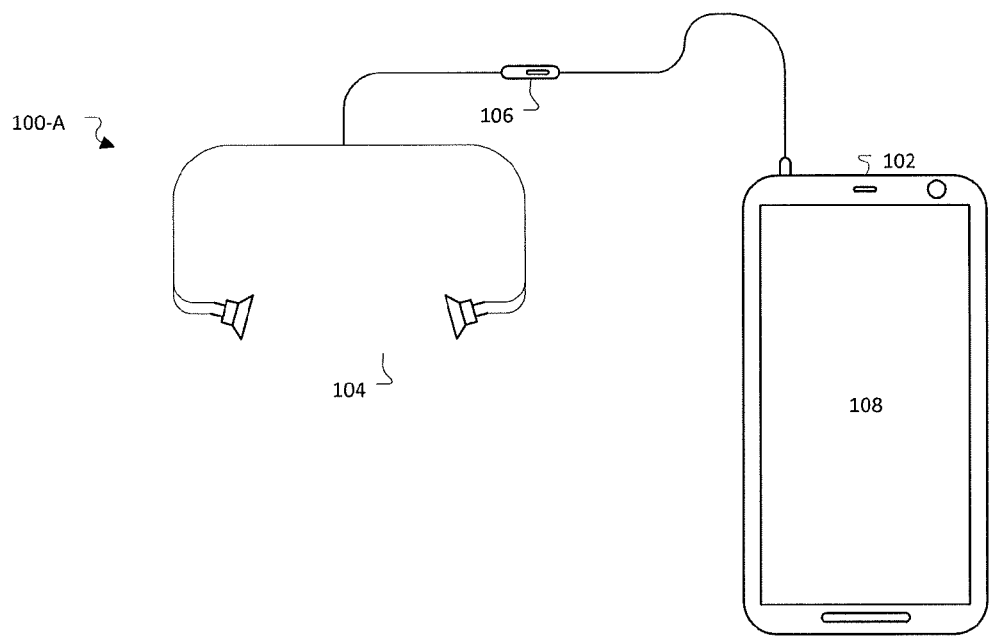
FIG. 1A is an audio playback apparatus including an audio device and an audio reproduction device having an integrated audio capture device in accordance to one embodiment.
Figure 1B:
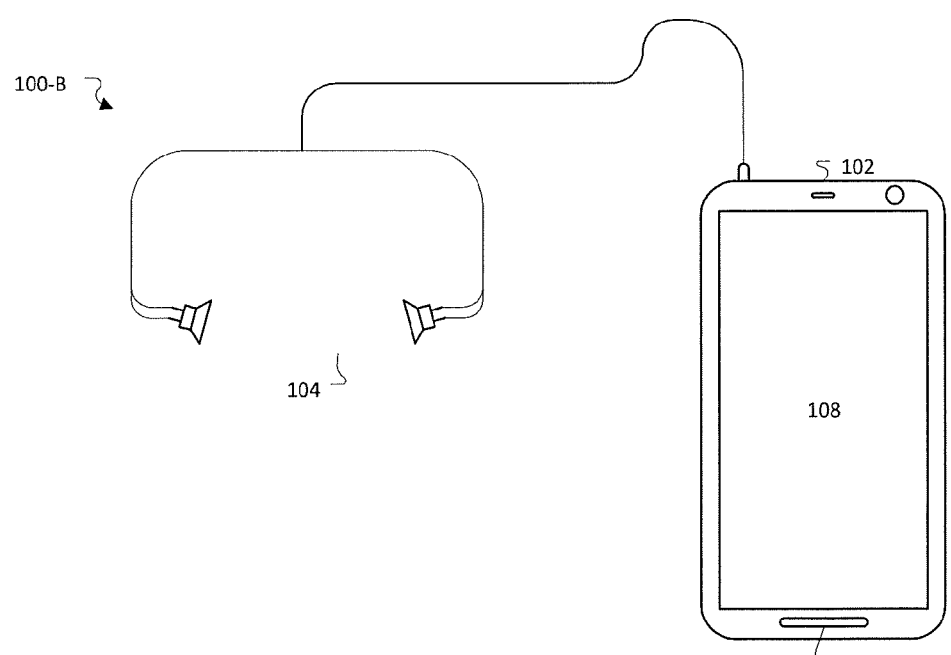
FIG. 1B is another audio playback apparatus including the mobile device having integrated audio capture device and an audio reproduction device in accordance to another embodiment.

FIG. 1A is an audio playback apparatus 100A including an audio device 102 and an audio reproduction device 104 having an integrated audio capture device 106 in accordance to one embodiment. FIG. 1B is another audio playback apparatus 100B including the audio device 102 having integrated audio capture device 106 and an audio reproduction device 104 in accordance to another embodiment.

The audio device 102 may be configured to provide audio content to a user of the audio device 102 for consumption. The audio device 102 may include various types of devices, such as a portable music player, a compact disk (CD) player, an audiocassette player, a personal computer, a portable computer, a personal digital assistant (PDA), a mobile phone, a tablet device, or a microprocessor-based entertainment device. The audio content may include music or talk from various sources, such as audio decoded from received radio transmissions, audio content received as a portion of a phone conversation, and audio content stored on the audio device 102 or on a storage medium provided to the audio device 102 (e.g., a compact disk, a tape, a memory card, etc.). The audio device 102 may be further configured to provide amplification circuitry (not shown) to allow the audio device 102 to drive the audio reproduction devices 104 with a signal including the audio content. The audio device 102 may also include controls to enable the user to select a volume level to be provided by the amplification circuitry to drive the audio reproduction devices 104.

The audio capture device 106 may be a microphone or other suitable device configured to convert sound waves into an electrical signal for use by the apparatus 100A. In some cases, the audio capture device 106 may be integrated into the audio reproduction device 104 as illustrated in the apparatus 100A, while in other cases the audio capture device 106 may be integrated into the audio device 102 as illustrated in the apparatus 100B as shown in connection with FIG. 1B. In other cases, the audio capture device 106 may be separate from both the audio device 102 and the audio reproduction device 104. If the model or type of the audio capture device 106 is identified by the apparatus 100A (e.g., based on its inclusion in a known audio device 102 or audio reproduction devices 104), the apparatus 100 may be able to identify a sound pressure level to associate with a particular level of electrical signal received from the audio capture device 106 based on a previously performed characterization of the audio capture device 106.

Figure 4:
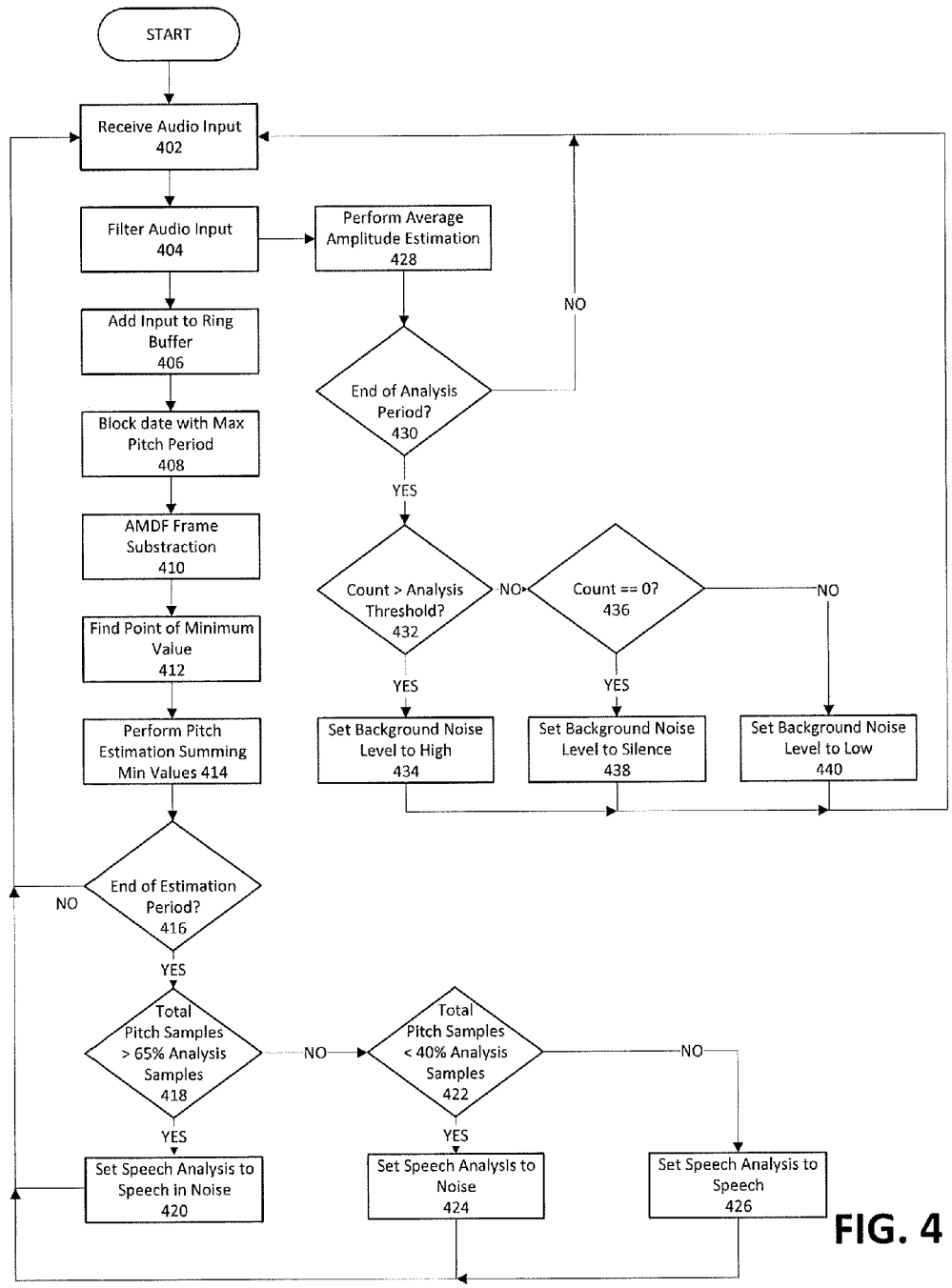
FIG. 4 is a method for performing intelligent environment sensing using the intelligent environment sensing apparatus.

The audio device 102 includes any number of processors for executing software, where the software (or programs) may be stored on one or more memory devices (not shown) that are accessible to the audio device 102. The apparatus 100A (or 100B) generally includes an intelligent environment sensing device 108 that includes any combination of hardware and software for executing any functions or operations as disclosed in connection with environment intelligent sensing. For example, it is recognized that the intelligent environment sensing device 108 may receive an application (or application program) and execute the application program with one or more processors to perform the various functions as noted herein in connection with the intelligent environment sensing device 108. The application program may be stored on a memory of the audio device 102 (e.g., as software, firmware, etc.). In some cases, the intelligent environment sensing device 108 may be provided as a local application shipped with the audio device 102, while in other cases the application program may be downloaded from an application store to the audio device 102. In general, the intelligent environment sensing device 108 may be configured to cause the audio device 102 to perform various operations related to the detection of environmental conditions surrounding a user of the audio device 102, and determine an audio adjustment to alter the volume of audio being provided to the user over the audio reproduction device 104. It is recognized that the intelligent environment sensing device 108 may be integrated into the audio reproduction device 104, into a standalone device, or into a combination of two or more of the audio device 102, the audio reproduction device 104, and other devices. Further aspects of the operation of the intelligent environment sensing device 108 are illustrated in FIGS. 2-4, discussed in detail below.

Figure 2:
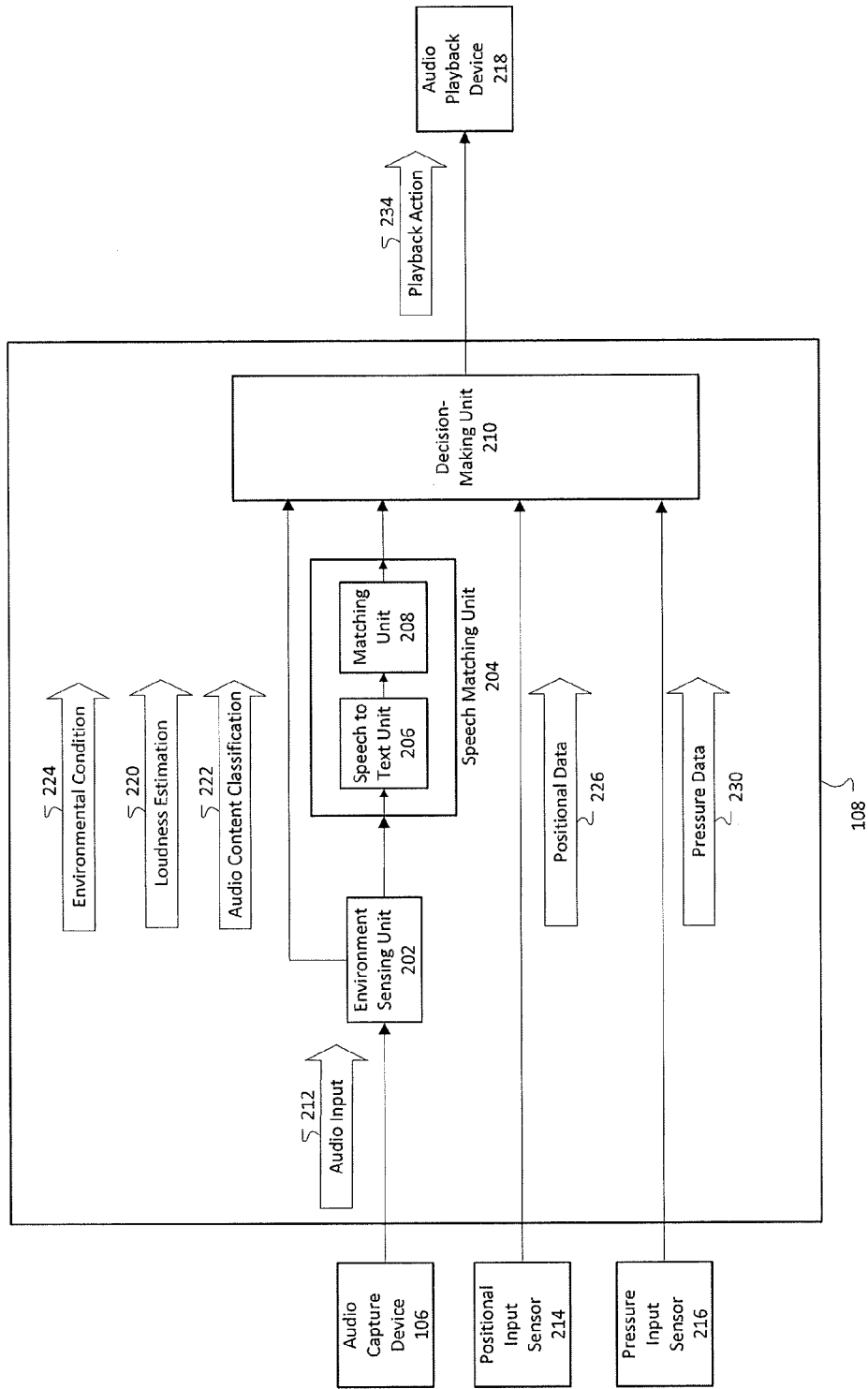
FIG. 2 is a more detailed implementation of the audio device including an intelligent environment sensing apparatus for performing audio adjustments based on intelligent environment sensing.

FIG. 2 is a more detailed implementation of the audio device 102 including the intelligent environment sensing device 108 for performing audio adjustments based on intelligent environment sensing. As illustrated, the intelligent environment sensing device 108 includes an environment sensing unit 202, a speech pattern matching unit 204, and a decision-making unit 210. The audio capture device 106 is configured to provide an audio input 212 to the environment sensing unit 202. A positional input sensor 214 is configured to provide positional data 226 to the decision-making unit 210. A pressure input sensor is configured to provide pressure data 230 to the decision-making unit 210. The decision-making unit 210 may be configured to provide playback actions 234 to an audio playback device 218 of the audio device 102, based on the audio input 212, the positional data 226, the positional input sensors 214 and the pressure data 230.

The environment sensing unit 202 may receive the audio input 212 from the audio capture device 106. Based on the audio input, the environment sensing unit 202 may perform a loudness analysis to determine a loudness estimation 220 indicative of a level of background noise included in the audio input 212. The environment sensing unit 202 may further perform a speech analysis to determine an audio content classification 222 indicative of whether speech is present in the received audio input 212.

To determine the loudness estimation 220, the environment sensing unit 202 may, for samples of the audio input 212, determine an average absolute amplitude, e.g., using a low pass filter according to the equation $y(n)=\beta*abs(x(n))+(1-\beta)*y(n)$, e.g., with $\beta=0.985$. The environment sensing unit 202 may compare the average amplitude to a predetermined loudness threshold, e.g., calibrated to or otherwise associated with the audio capture device 106, to determine whether the audio input 212 exceeds the predetermined loudness threshold. If the model or type of the audio capture device 106 is known by the environment sensing unit 202 (e.g., based on its inclusion in a known audio device 102 or audio reproduction devices 104), the environment sensing unit 202 may be able to identify a sound pressure level to associate with the audio input 212 based on a previously performed characterization of the audio capture device 106.

The environment sensing unit 202 may maintain a count of the number of samples of the audio input 212 that exceed the threshold over a predefined period of time (e.g., one tenth of a second, one second, three seconds, etc.). With reference to FIG. 3A, if the count exceeds a threshold value, then the loudness conditions may be considered to be relatively high loudness 220-A. If sound is detected but with a loudness less than the threshold value, then the loudness conditions may be considered to be a relatively low loudness 220-B. If substantially no sound is detected, the loudness conditions may be considered to be silence 220-C.

Referring back to FIG. 2, to perform the audio content classification, the environment sensing unit 202 may pass the audio input 212 through a band pass filter, e.g., passing frequencies between 175 and 495 Hz to select for the first formant of speech. The pitch of the signal may be estimated for a period of time corresponding to a predetermined number of samples (e.g., 20 milliseconds of data regardless of sampling rate). This period of time may be referred to as the estimation period. The environment sensing unit 202 may estimate the pitch using an average magnitude difference function (AMDF), as one possibility, as discussed in more detail below. If the environment sensing unit 202 determines that a pitch within the expected range for a first formant of speech is included in the samples, the frame including the pitch may be indicated as including speech. If the environment sensing unit 202 determines that at least a threshold amount of samples within the estimation period include pitches indicative of speech, then, with reference to FIG. 3B, the environment sensing unit 202 may determine that the audio input 212 includes speech 222-A. If the environment sensing unit 202 determines that a lower threshold amount of samples within the estimation period include pitches indicative of speech, then, the environment sensing unit 202 may determine that the audio input 212 includes speech and noise 222-C. Otherwise, the environment sensing unit 202 may determine that the audio input 212 does not include speech 222-B.

Based on the loudness estimation 220 and audio content classification 222, the environment sensing unit 202 may be configured to provide an indication of an environmental condition 224 based on the audio input 212. With reference to FIG. 3C, the environmental condition 224 may include, for example: (i) a speech-in-quiet condition 224-A in which speech is detected with relatively quiet background noise, (ii) a speech-in-noise condition 224-B in which speech is detected with a relatively loud background noise (or where only a lower threshold amount of speech is detected), (iii) a noise condition 224-C in which no speech is detected but background noise exists, and (iv) a quiet condition 224-D in which no speech is detected and with relatively quiet background noise. (It should be noted that if there is substantially no noise in the audio input 212, then the loudness estimation 220 may conclude that the environmental conditions 224 are of a silent condition 224-D without performing or reviewing the results of audio content classification.) Referring back to FIG. 2, the indication of the environmental condition 224 may be provided to the speech pattern matching unit 204 and the decision-making unit 210.

If speech is detected (e.g., a speech-in-quiet condition 224-A or a speech-in-noise condition 224-B), then the speech pattern matching unit 204 may perform (or report the results of) speech recognition on the audio input 212. More specifically, the speech pattern matching unit 204 may include a speech-to-text unit 206 and a matching unit 208. The speech-to-text unit 206 may be configured to translate speech included in the audio input 212 into text. In an example, the speech-to-text unit 206 may implement speech-to-text translation using speech-to-text engine implemented as a component of the Android operating system distributed by Google Inc. of Mountain View, Calif. The matching unit 208 may be configured to compare the recognized speech with user-customizable text. The user-customizable text may include a listing of names, nicknames, or phrases such that when one or more is matched, the matching unit 208 may determine that a speaker is attempting to communicate with the user. If a match is found, the matching unit 208 is configured to inform the decision-making unit 210 of the match. The matching unit 208 may be further configured to provide a user interface through which the user may configure the list of names or other relevant speech to be matched by the speech pattern matching unit 204. For example, the speech pattern matching unit 204 may attempt to match the audio input 212 with the name of the user (or other relevant speech that may be used to gain the attention of the user) to determine whether the user is being called or otherwise warned by another. The speech pattern matching unit 204 may inform the decision-making unit 210 of the status of the speech matching performed on the audio input 212.

The decision-making unit 210 may also receive input indicative of the movement of the audio device 102. As one possibility, the decision-making unit 210 may receive the positional data 226 in the form of accelerometer information (e.g., accelerometer position data 226) from the positional input sensor 214, and may determine, based on the accelerometer position data 226, a position estimation 228 indicative of whether the user is remaining at a relatively fixed location, or whether the user is walking at a slow or fast rate. As another possibility, the decision-making unit 210 may receive the positional data 226 in the form of GPS information (e.g., GPS positional data 226) (or other suitable positional data 226) instead of or in addition to the accelerometer positional data 226, and the decision-making unit 210 may utilize the GPS positional data 226 (or other positional data 226) to determine whether the audio device 102 is stationary or moving. With reference to FIG. 3D, the position estimation 228 may include, for example, (i) a static position estimation 228-A in which the device does not appear to be moving, and (ii) a changing position estimation 228-B in which the device does appear to be moving. Further gradation of the changing position estimation 228-B may also be provided, such as (iii) a low speed position estimation 228-C in which the device is moving at a relatively slow rate, such as a walking speed, and (iv) a high speed position estimation 228-D in which the device is moving at a relatively fast speed, such as a speed indicative of the user being in a vehicle rather than walking.

As noted above, the decision-making unit 210 may also receive pressure data 230 from the pressure input sensor 216. The decision-making unit 210 may use the pressure data 230 to perform a pressure estimation 232 to identify sudden changes in external conditions, e.g., due to a user dropping the pressure input sensor 216 (e.g., dropping a music player device including the pressure input sensor 216) or the user otherwise making sudden movements indicative of the user being struck or hurt. With reference to FIG. 3E, the pressure estimation 232 may include, for example, (i) a normal pressure 232-A in which the device does not appear to have been dropped, and (ii) a sudden change pressure 232-B in which the device appears to have suffered a sudden movement.

Based on the inputs, the decision-making unit 210 may determine a playback action 234 to send to an audio playback device 218, where the audio adjustment may alter the volume of audio being listened to by the user via the audio reproduction device 104. Table 1 illustrates an exemplary mapping of playback actions 234 based on the aforementioned inputs to the decision-making unit 210.

TABLE 1

| Audio Content Classification | Loudness Estimation | Device Movement | Playback Action |
|---|---|---|---|
| SIQ | Low | Static/Low/High Speed | Normal Volume |
| SIQ | High | Static/Low/High Speed | Low Volume |
| SIN | Low | Static/Low/High Speed | Normal Volume |
| SIN | High | Static/Low/High Speed | Low Volume |
| Noise | Low | Static/Low speed | Normal Volume |
| Noise | High | Static/Low speed | Lower Volume |
| Noise | High | High Speed | Mute |
| Silence | N/A | Static/Low speed | Normal Volume |

It should be noted that the mapping of Table 1 is merely exemplary, and alternate mappings of playback actions 234 may be utilized. Moreover, in some cases one or more of the user, the manufacturer of the environment sensing unit 202, or the manufacturer of the audio device 102 may customize the mapping of playback actions 234 according to user or manufacturer preferences. As one possibility, intelligent environment sensing device 108 may provide a user interface to the user using the audio device 102 to facilitate the configuration of the mapping of playback actions 234.

In some examples, the decision-making unit 210 may further determine an override to the playback action 234 based on additional criteria. For example, if a speech pattern match is made, or if the pressure sensor indicates a sudden change in movement, the playback action 234 may be overridden to mute the audio. These override conditions may also be customizable as well.

FIG. 4 is a method 400 for performing intelligent environment sensing using the intelligent environment sensing device 108. The method 400 may be performed, for example, by an intelligent environment sensing device 108, executed by one or more of an audio device 102, an audio reproduction device 104, and one or more other computing devices.

At block 402, the intelligent environment sensing device 108 receives the audio input 212. For example, the intelligent environment sensing device 108 may receive the audio input 212 from an audio capture device 106 included in the audio device 102. As other examples, the intelligent environment sensing device 108 may receive the audio input 212 from the audio capture device 106 included in the audio reproduction device 104 or from an audio capture device 106 separate from both the audio device 102 and from the audio reproduction device 104.

At block 404, the intelligent environment sensing device 108 filters the audio input 212. For example, an environment sensing unit 202 of the intelligent environment sensing device 108 may filter the audio input 212 to a range of frequencies useful for detection of first formants of speech.

At block 406, the intelligent environment sensing device 108 adds a current input sample to a ring buffer. The ring buffer may include, for example, a fixed number of the most recent received input samples (e.g., space sufficient to hold 20 milliseconds of data regardless of sampling rate), such that the oldest sample in the ring buffer is replaced with the current input sample.

At block 408, the intelligent environment sensing device 108 identifies a sample of data in the ring buffer having a maximum pitch period. For example, if a pitch within a range from 96 Hz to 400 Hz is targeted, the pitch period may be calculated according to the sampling frequency used.

At block 410, the intelligent environment sensing device 108 performs average magnitude difference function (AMDF) frame subtraction. AMDF is a technique for estimating the pitch period of voiced speech sounds. In AMDF, a difference signal is formed between delayed speech and an original such that for each delay, the absolute magnitude of the difference is taken. For example, the intelligent environment sensing device 108 may perform a difference between the most recent input sample and each of the other input samples of the ring buffer.

At block 412, the intelligent environment sensing device 108 finds a point of minimum value. For example, based on the differences between the most recent input sample and each of the other input samples of the ring buffer, the intelligent environment sensing device 108 may identify a relative null point at a delay corresponding to the pitch period of a voiced sound.

At block 414, the intelligent environment sensing device 108 performs pitch estimation according to the minimum values. For example, based on the identified relative null point, the intelligent environment sensing device 108 may estimate a pitch of a first speech formant captured in the audio input 212.

At decision point 416, the intelligent environment sensing device 108 determines whether the end of the estimation period has been reached. For example, the intelligent environment sensing device 108 may determine whether a predefined estimation period of time has elapsed. The estimation period may be a predefined amount of time, such as one tenth of a second, one second or three seconds, as some possibilities. If the estimation period of time has elapsed, the estimation period is reset and control passes to decision point 418. Otherwise control passes to block 402.

At decision point 418, the intelligent environment sensing device 108 determines whether the total pitch samples including first formant candidates exceeds a first predetermined threshold of the analysis samples. The first predetermined threshold may be, for example approximately 65% of the samples across a predetermined number of estimation periods in an analysis period. If so, control passes to block 420. Otherwise, control passes to decision point 422.

At block 420, the intelligent environment sensing device 108 sets the environmental condition 224 to speech in noise 224-B. After block 420, control passes to block 402.

At decision point 422, the intelligent environment sensing device 108 determines whether the total pitch samples including first formant candidates do not exceed a second predetermined threshold of the analysis samples. The second predetermined threshold may be lower than the first predetermined threshold and may be, for example approximately 40%. If so, control passes to block 424. Otherwise, control passes to block 426.

At block 424, the intelligent environment sensing device 108 sets the environmental condition 224 to noise 224-C. After block 424, control passes to block 402.

At block 426, the intelligent environment sensing device 108 sets the environmental condition 224 to speech in quiet 224-A. After block 426, control passes to block 402.

At block 428, and also based on the audio input 212 of block 404, the intelligent environment sensing device 108 performs average amplitude estimation. For example, the environment sensing unit 202 of the intelligent environment sensing device 108 may determine an average absolute amplitude, e.g., using a low pass filter according to the equation $y(n)=\beta*abs(x(n))+(i-\beta)*y(n)$. (It should be noted that in some examples the pre-filtered audio input 212 may instead be utilized.)

At decision point 430, the intelligent environment sensing device 108 determines whether the end of the amplitude estimation analysis period is reached. For example, the environment sensing unit 202 may perform amplitude analysis averaged over a predefined period of time, such as over one tenth of a second, over one second or over three seconds. The environment sensing unit 202 may further maintain a count of the number of samples of the audio input 212 that exceed the threshold over the predefined period of time. If a period of estimation has been completed, control passes to decision point 432. Otherwise, control passes to block 402 to receive additional audio samples.

At decision point 432, the intelligent environment sensing device 108 determines whether the count exceeds the analysis threshold. If the count of the number of samples of the audio input 212 that exceeds a threshold value, then the loudness conditions may be considered to be relatively high loudness 220-A, and control passes to block 434. Otherwise, control passes to decision point 436.

At block 434, the intelligent environment sensing device 108 sets the loudness estimation 220 to high loudness 220-A. After block 440, control passes to block 402.

At decision point 436, the intelligent environment sensing device 108 determines whether the count is zero. If so, then substantially no sound was received and control passes to block 438. Otherwise, control passes to block 440.

At block 438, the intelligent environment sensing device 108 sets the loudness estimation 220 to silence 220-C. After block 440, control passes to block 402.

At block 440, the intelligent environment sensing device 108 sets the loudness estimation 220 to low loudness 220-B. After block 440, control passes to block 402.

Variations on the method 400 are possible. As one possibility, other techniques for speech detection may be utilized in addition to or instead of AMDF, such as autocorrelation or linear predictive coding.

Figure 5:
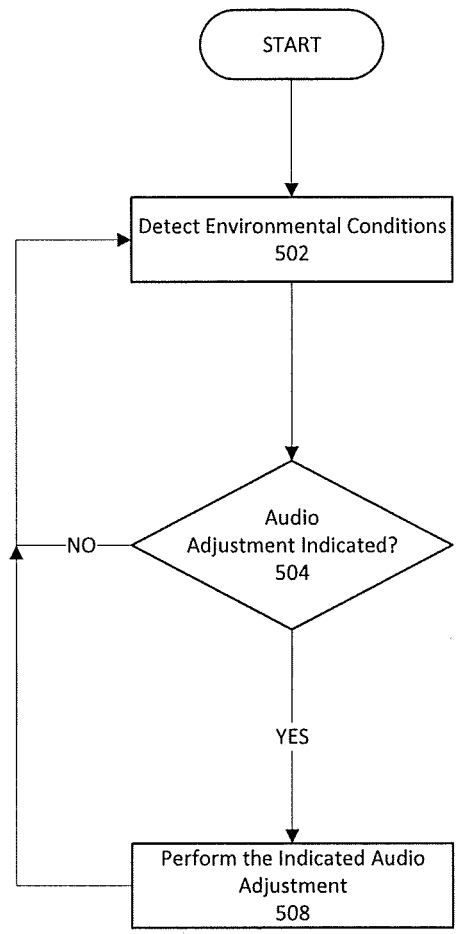
FIG. 5 is a method for performing audio adjustments based on environmental conditions.

FIG. 5 is a method 500 for performing audio adjustments based on environmental conditions. As with the method 400, the method 500 may be performed, for example, by the intelligent environment sensing device 108 executed by one or more of the audio device 102, the audio reproduction device 104, and one or more other computing devices.

At block 502, the intelligent environment sensing device 108 detects environmental conditions. For example, an environment sensing unit 202 of the intelligent environment sensing device 108 may utilize a method such as the method 400 to perform loudness estimation 220 and audio content classification 222. As another example, the intelligent environment sensing device 108 may receive input indicative of device movement, such as the accelerometer positional data 226 from the positional input sensor 214 or the GPS positional data 226 from a GPS receiver. As yet a further example, the intelligent environment sensing device 108 may receive the pressure data 230, e.g., from the pressure input sensor 216, to identify sudden changes in external conditions, e.g., due to the user dropping the pressure input sensor 216.

At decision point 504, the intelligent environment sensing device 108 determines whether an audio adjustment should be provided to an audio playback device 218. For example, a decision-making unit 210 of the intelligent environment sensing device 108 may utilize a mapping of playback actions 234 such as that described in Table 1 to identify an audio adjustment, based on input of the detected environmental conditions 224, the positional data 226 and the pressure data 230 to the decision-making unit 210. The audio adjustment may include one or more of the playback actions 234 to alter the volume of audio being provided by the audio playback device 218 and listened to by the user via the audio reproduction device 104. Exemplary playback actions 234 may include increasing the volume, reducing the volume, or muting the audio being listened to by the user via the audio reproduction device 104. If the intelligent environment sensing device 108 determines to perform an audio adjustment, control passes to block 506. Otherwise, control passes to block 502 to continue detecting environmental conditions.

At block 506, the intelligent environment sensing device 108 performs the indicated audio adjustment. For example, the intelligent environment sensing device 108 may provide the playback action 234 to the audio playback device 218. After block 506, control passes to block 502.

While an exemplary modularization of the intelligent environment sensing device 108 is described herein, it should also be noted that that the units 202-210 may be incorporated into fewer units or may be combined in several units or even in one unit.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

Computing devices described herein generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

With regard to the processes, systems, methods, heuristics, etc., described herein, it should be understood that, although the steps of such processes, etc., have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

What is claimed is:

1. A system comprising:
an audio playback device configured to drive an audio reproduction device at a volume level;
an audio capture device configured to convert sound waves into an audio input; and
an environment sensing device configured to
detect, based on the audio input, environmental conditions surrounding a user of the audio playback device, the environmental conditions including a loudness estimation indicative of a level of background noise included in the audio input and an audio content classification indicative of a presence of speech in the audio input, determine, according to the environmental conditions, a playback action to alter the volume level being provided by the audio playback device, and provide, to the audio playback device, an adjustment to the volume level in accordance with the playback action.

2. The system of claim 1, wherein the environment sensing device is further configured to determine the playback action according to a mapping of environmental conditions to playback actions, wherein the mapping specifies to lower the volume level when: (i) the audio content classification indicates the presence of speech and the loudness estimation indicates a loudness condition below a predefined sound pressure level, or (ii) the audio content classification indicates a presence of background noise and the loudness estimation indicates a loudness condition above the predefined sound pressure level.

3. The system of claim 1, wherein the audio capture device is integrated into one of: (i) the audio playback device, or (ii) the audio reproduction device.

4. The system of claim 1, wherein the environment sensing device is further configured to:

determine an average absolute amplitude of the audio input;

identify a sound pressure level according to the average absolute amplitude according to a sound-input-level characterization of the audio capture device;

count a number of samples of the audio input that exceed a pre-determined loudness threshold over a predetermined period of time; and determine that the loudness estimation corresponds to one of (i) a high loudness condition when the count exceeds a threshold value, (ii) a low loudness condition when the count does not exceed the threshold value, and (iii) a silence condition when the audio input includes substantially no sound information.

5. The system of claim 1, wherein the environment sensing device is further configured to:

pass the audio input through a band pass filter to select for first formants of speech;

estimate a pitch of the audio input;

count a number of samples of the audio input in which the pitch is within a range for a first formant of speech over a predetermined period of time; and determine that the audio content classification corresponds to one of (i) a speech and noise condition when the count exceeds a first threshold value, (ii) a speech condition when the count exceeds a second threshold value but does not exceed the first threshold value, and (iii) a noise condition when the count does not exceeds the second threshold value.

6. The system of claim 5, wherein the environment sensing device is further configured to estimate the pitch using an average magnitude difference function (AMDF), the first threshold value is approximately 65% of the samples, and the second threshold value is approximately 40% of the samples.

7. The system of claim 1, wherein the environment sensing device is further configured to:

perform recognition of the speech on the audio input;

compare the recognized speech with user-customizable text; and mute the volume level when a match is detected of the recognized speech with the user-customizable text.

8. The system of claim 7, wherein the environment sensing device is further configured to, when the environment sensing device is moving, further determine (i) a first speed changing position in which the environment sensing device is moving at a rate indicative of travel without a vehicle, and (ii) a second speed changing position in which the device is moving at a speed indicative of travel within the vehicle.

9. The system of claim 1, wherein the environment sensing device is further configured to:

receive accelerometer positional data;

determine, based on the accelerometer position data, a position change of one of: (i) a static position in which the environment sensing device is not moving, and (ii) a changing position in which the environment sensing device is moving; and determine the playback action to be performed further according to a determined position change estimation of the enviroment sensing device.

10. The system of claim 1, further comprising a pressure sensor, wherein the environment sensing device is further configured to mute the volume level when the pressure sensor indicates a change in movement.

11. A method comprising:

detecting, based on audio input from an audio capture device, environmental conditions surrounding a user of an audio playback device driving an audio reproduction device at a volume level, the environmental conditions including a loudness estimation indicative of a level of background noise included in the audio input and an audio content classification indicative of presence of speech in the audio input;

determining, according to the environmental conditions, a playback action to alter the volume level being provided by the audio playback device; and providing, to the audio playback device, an adjustment to the volume level according to the playback action.

12. The method of claim 11, further comprising determining the playback action according to a mapping of environmental conditions to playback actions, wherein the mapping specifies to lower the volume level when: (i) the audio content classification indicates the presence of speech and the loudness estimation indicates a loudness condition below a predefined sound pressure level, or (ii) the audio content classification indicates a presence of noise and the loudness estimation indicates a loudness condition above the predefined sound pressure level.

13. The method of claim 11, further comprising:

determining an average absolute amplitude of the audio input;

identifying a sound pressure level according to the average absolute amplitude according to a sound-input-level characterization of the audio capture device;

counting a number samples of the audio input that exceed a pre-determined loudness threshold over a predetermined period of time; and determining that the loudness estimation corresponds to one of (i) a high loudness condition when the count exceeds a threshold value, (ii) a low loudness condition when the count does not exceed the threshold value, and (iii) a silence condition when the audio input includes substantially no sound information.

14. The method of claim 11, further comprising:

passing the audio input through a band pass filter to select for first formants of speech;

estimating a pitch of the audio input;

counting a number of samples of the audio input in which the pitch is within a range for a first formant of speech over a predetermined period of time; and determining that the audio content classification corresponds to one of (i) a speech and noise condition when the count exceeds a first threshold value, (ii) a speech condition when the count exceeds a second threshold value but does not exceed the first threshold value, and (iii) a noise condition when the count does not exceeds the second threshold value.

15. The method of claim 11, further comprising one or more of:

performing recognition of the speech on the audio input, comparing the recognized speech with the user-customizable text, and muting the volume level when a match is detected of the recognized speech with the user-customizable text; and muting the volume level when data received from a presure sensor indicates a change in movement of the audio playback device.

16. A non-transitory computer-readable medium comprising computer instructions that, when executed by a processor of an audio playback device, cause the audio playback device to perform operations including to:

detect, based on audio input from an audio capture device, environmental conditions surrounding a user of an audio playback device driving an audio reproduction device at a volume level, the environmental conditions including a loudness estimation indicative of a level of background noise included in the audio input and an audio content classification indicative of presence of speech in the audio input;

determine, according to the environmental conditions, a playback action to alter the volume level being provided by the audio playback device; and provide an adjustment to the volume level in accordance with the playback action.

17. The medium of claim 16, further comprising instructions configured to cause the audio playback device to determine the playback action according to a mapping of environmental conditions to playback actions, wherein the mapping specifies to lower the volume level when: (i) the audio content classification indicates the presence of speech and the loudness estimation indicates a loudness condition below a predefined sound pressure level, or (ii) the audio content classification indicates a presence of noise and the loudness estimation indicates a loudness condition above the predefined sound pressure level.

18. The medium of claim 16, further comprising instructions configured to cause the audio playback device to:

determine an average absolute amplitude of the audio input;

identify a sound pressure level according to the average absolute amplitude according to a sound-input-level characterization of the audio capture device;

count a number of samples of the audio input that exceed a pre-determined loudness threshold over a predetermined period of time; and determine that the loudness estimation corresponds to one of (i) a high loudness condition when the count exceeds a threshold value, (ii) a low loudness condition when the count does not exceed the threshold value, and (iii) a silence condition when the audio input includes substantially no sound information.

19. The medium of claim 16, further comprising instructions configured to cause the audio playback device to:

pass the audio input through a band pass filter to select for first formants of speech;

estimate a pitch of the audio input;

count a number of samples of the audio input in which the pitch is within a range for a first formant of speech over a predetermined period of time; and determine that the audio content classification corresponds to one of (i) a speech and noise condition when the count exceeds a first threshold value, (ii) a speech condition when the count exceeds a second threshold value but does not exceed the first threshold value, and (iii) a noise condition when the count does not exceeds the second threshold value.

20. The medium of claim 16, further comprising instructions configured to cause the audio playback device to one or more of:

perform recognition of the speech on the audio input, compare the recognized speech with user-customizable text, and mute the volume level when a match is detected of the recognized speech with the user-customizable text; and mute the volume level when data received from a pressure sensor indicates a change in movement of the audio playback device.

* * * * *